United States Patent [19]

Borchert et al.

[11] Patent Number: 5,461,318

[45] Date of Patent: Oct. 24, 1995

[54] APPARATUS AND METHOD FOR IMPROVING A TIME DOMAIN REFLECTOMETER

[76] Inventors: Marshall B. Borchert; Douglas A. Hartzell; Edward J. Thomassen; Lee M. Rezac, all of 5101 N. 57th St., Lincoln, Nebr. 68507

[21] Appl. No.: 255,352

[22] Filed: Jun. 8, 1994

[51] Int. Cl.⁶ .................................................. G01R 31/11
[52] U.S. Cl. ........................................... 324/533; 324/532
[58] Field of Search .................................... 324/522, 527, 324/525, 532–535, 541, 543, 544, 551; 379/26

[56] References Cited

U.S. PATENT DOCUMENTS

| | | | |
|---|---|---|---|
| 2,493,800 | 1/1950 | Biskeborn | 324/532 |
| 3,255,406 | 6/1966 | Schulter | 324/533 |
| 3,800,216 | 3/1974 | Hamilton | 324/523 |
| 4,400,663 | 8/1983 | May | 324/525 |
| 4,446,421 | 5/1984 | Berde | 324/523 |
| 4,739,276 | 4/1988 | Graube | 324/534 |
| 4,970,466 | 11/1990 | Bolles et al. | 324/533 |
| 5,063,353 | 11/1991 | Gubisch | 324/710 |
| 5,319,311 | 6/1994 | Kawashima | 324/533 |

*Primary Examiner*—Maura K. Regan
*Attorney, Agent, or Firm*—Zarley, McKee, Thomte, Voorhees & Sease; Mark D. Frederiksen

[57] ABSTRACT

A method for detecting impedance discontinuities in two-conductor cable includes the initial step of transmitting a pulse of energy onto the cable and receiving any reflected pulses at a base location. The distance to the discontinuity is calculated by measuring the elapsed time between the transmitted and received pulses. A waveform is created on a display screen to shown the transmitted and reflected pulses, by taking a plurality of horizontal samples along the cable, and calculating a vertical value for each horizontal sample taken. Each horizontal sample is then converted to digital form and displayed on the screen. Another step in the method includes determining the gauge of the cable and then subtracting the exponential decay of the transmitted pulse waveform based upon that determined cable gauge so as to create a modified transmitted pulse which is displayed on the screen. The method also includes the step of adjusting the calculation of the distance to the discontinuity so as to account for a decrease in the velocity of propagation of the transmitted and received pulses over the length of the cable. A method for detecting a bridge tap in a twisted pair cable includes the steps of transmitting a pulse of energy onto the cable and receiving any reflected energy pulses at a base location. The gauge of the cable is then determined and the phase of any reflected energy pulses are determined. The amplitude and distance from the base location is determined for each reflected pulse which is out of phase relative to the transmitted energy pulse, to create pulse values. These pulse values are then compared with predetermined pulse values for the particular cable gauge and type to identify the location of a pulse value which is within a predetermined range of pulse values for a bridge tap discontinuity.

2 Claims, 10 Drawing Sheets

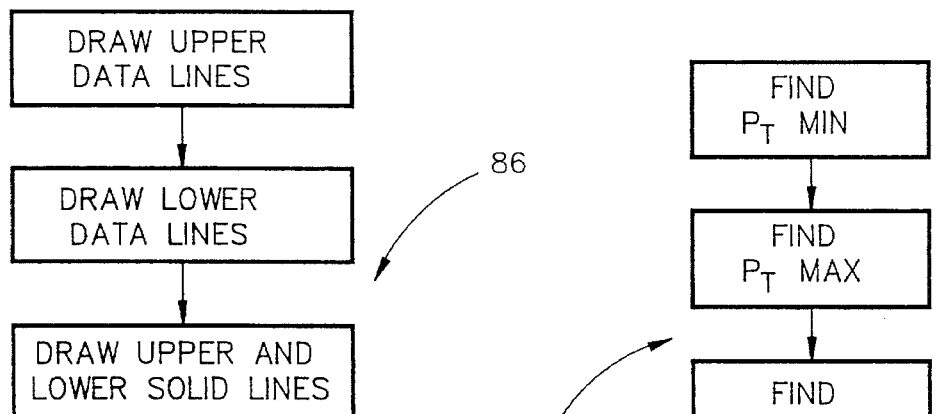
FIG. 14
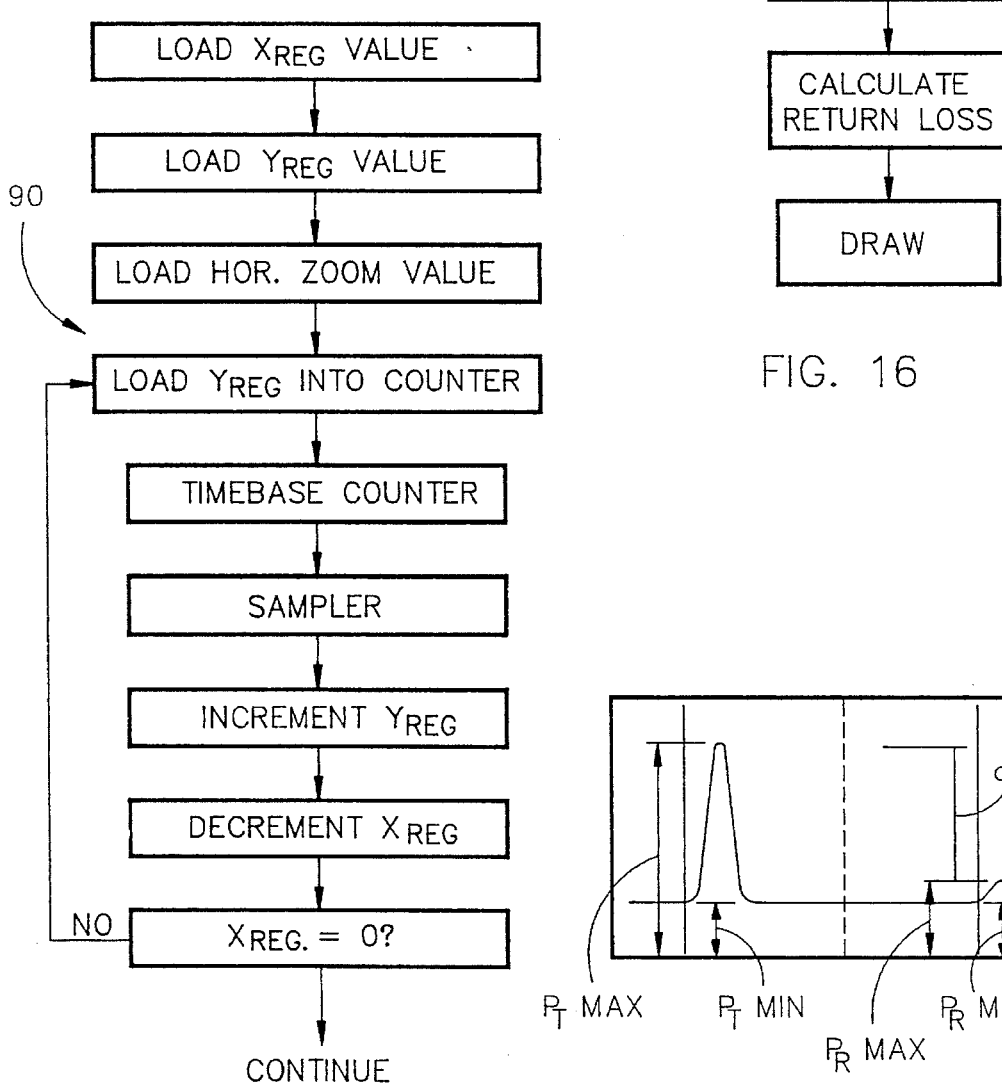
FIG. 16
FIG. 15
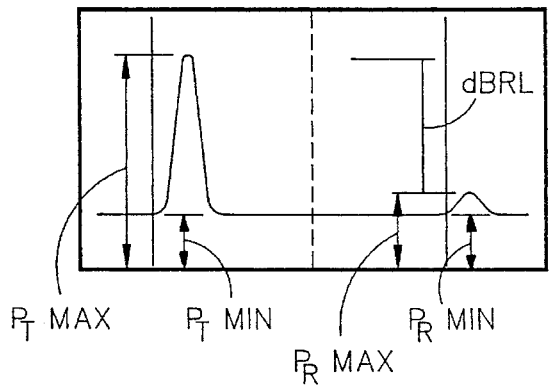
FIG. 17

APPARATUS AND METHOD FOR IMPROVING A TIME DOMAIN REFLECTOMETER

TECHNICAL FIELD

The present invention relates generally to apparatus for detecting faults in conductor cables, and more particularly to an improved time domain reflectometer modified to extend distance readability and to detect bridge taps when testing a twisted pair cable.

BACKGROUND OF THE INVENTION

A time domain reflectometer (TDR) is an instrument utilized to detect faults (impedance discontinuities) in constant impedance transmission media, such as two-conductor cable. A TDR detects discontinuities in a length of cable by transmitting a pulse of energy on to the cable; receiving and detecting any reflected energy; and measuring the elapsed time from the transmission of the energy pulse to the receipt of the reflection. Thus, the major components of a TDR include a signal transmitter, a signal receiver, and a signal display device for displaying the transmitted and received signals.

As the transmitted energy pulse from the TDR travels down the cable, all of the pulse energy will be absorbed if the cable is properly terminated and the cable has a constant impedance. If the pulse reaches an impedance discontinuity, part or all of the pulse energy is reflected back to the TDR. As shown in FIG. 1, if the cable fault is an open circuit, the reflected pulse will be in phase (have the same polarity) with the incident pulse. If the cable is short circuited, the reflected pulse will be out of phase (have the opposite polarity) with the incident pulse, as shown in FIG. 2. In either case, a substantial amount of energy is reflected by the discontinuity.

As noted above, a dead short and a complete open both reflect all the pulse energy back from the discontinuity. Other faults that are less severe will reflect varying degrees of energy. A special case, unique to twisted pair cables such as telephone cable, is a bridge tap. A bridge tap is when a second twisted pair has been connected or bridged across an existing trunk line. One example would be where a plurality of party line phones are bridged onto the last subscriber out from the central office. In such a case, three bridge taps would be located along the line, one for each party line phone.

The phase relationship between the incident and reflected pulses is used to determine the type of fault causing the reflection. Reflections from an impedance higher than the characteristic impedance of the cable are in phase. Reflections from a lower impedance are out of phase. The TDR measures the time between the transmitted pulse and reflected pulse to determine the distance to the discontinuity. Use of a digitized waveform, as shown in FIGS. 1 and 2, enables the operator of the TDR to view the signature of the cable in great detail.

Energy pulses travel down different types of cables at different speeds. The speed at which a signal travels is called the velocity of propagation (VOP). VOP is measured as a percentage of the speed of light in free space.

One problem encountered in the testing of twisted pair cable relates to the natural attenuation of a transmitted signal by the resistive, inductive, and capacitive components of the particular cable under test. Because the amplitude of the pulse is reduced by this attenuation, or loss, in the cable, major faults at long distances may appear to be the same as minor faults close to the TDR, as shown in FIGS. 3 and 4. FIGS. 3 and 4 show a cable having the same type but different severity of fault, but because of cable loss, the amplitude of the reflected pulse in FIG. 4 is less than the amplitude of the reflected pulse in FIG. 3. The only difference between FIGS. 3 and 4, is that the location of the fault in FIG. 4 is at a greater distance than that of the fault in FIG. 3.

This natural attenuation present in cables limits the ability of a TDR to test infinitely long cables. The maximum length of cable which may be tested is determined is by: (a) the attenuation per foot at a particular frequency of the cable; (b) the amplitude of the transmitted pulse; and (c) the sensitivity of the TDR's receiver. Because TDRs provide variable pulse widths, the cable loss per foot may be decreased, so as to permit testing of longer lengths of cable, by increasing the pulse width and thus lowering the fundamental frequency of the pulse. The sensitivity of the TDR receiver is determined by the resolution of the TDR's sample and the analog to digital (A/D) sub-system. The pulse amplitude is set at a voltage amplitude which does not overdrive the receiver sub-system. More specifically, the sensitivity of a TDR is defined by the difference in the amplitude of the transmitted pulse, and the amplitude of the smallest reflected pulse which can be detected by the TDR.

Because TDRs have a maximum output voltage, it is not possible to merely increase signal amplitude in order to overcome the loss involved in long lengths of cable. Similarly, the minimum resolvable voltage of the analog to digital converter is fixed by those components which are currently available on the market.

One particular problem found in twisted pair cable, such as is commonly utilized in telephone cable, is that twisted pair cable is particularly lossy at the high frequencies utilized by a TDR. To compound the problem, telephone companies have a propensity for using very long cables.

Cable impedance is determined by the inductive and capacitive electrical components of the particular cable. The loss in the cable is the resistive electrical component of the cable. The inductive and capacitive electrical components of the cable also cause the TDR's high frequency pulses to have an exponential decay. FIG. 5 shows the waveform of a base line, or ideal cable with no exponential decay in broken line as $I_B$. However, an exponential decay of a cable causes the slope of the incident pulse to lengthen to a very shallow slope, as shown in solid line at $I_D$.

Thus, exponential decay in a cable greatly enhances the difficulty in detecting a fault at long distances because: (1) the amplitude of the reflected pulse gets smaller, and (2) the reflected pulse gets "lost" in the curve of the exponential decay. As shown in FIG. 6, a reflected pulse $R_D$ has only a very slight change in the slope of the decayed waveform of transmitted pulse $I_D$. However, the reflected pulse $R_B$ is much more readily apparent in the base line waveform of the "ideal" cable with incident pulse $I_B$.

A further complicating element lies in the fact that different diameters or gauges of cable have different exponential decay rates, as shown in FIG. 7. Thus, a fault that may be within the range of sensitivity of a TDR on a 19 gauge cable, may not be detectable if the cable is 22 gauge or smaller.

In the case of bridge taps, a special problem for the testing of twisted pair cable arises. A telephone company that wants to convert an old subscriber physical pair to a high frequency T-carrier line may run into bridge taps which can foul the system. Unfortunately, the presence and location of all bridge taps are not always identified in plant records.

SUMMARY OF THE INVENTION

It is therefore a general object of the present invention to provide an improved TDR with extended distance detectability of discontinuities in a twisted pair cable.

Another object is to provide an improved method for extending the distance which a TDR can detect a minimum resolvable voltage.

A further object is to provide an improved method and apparatus for detecting a physical bridge tap and distinguishing the bridge tap from a simple cable fault.

These and other objects will be apparent to those skilled in the art.

The method for detecting impedance discontinuities in two-conductor cable of the present invention includes the initial step of transmitting a pulse of energy onto the cable and receiving any reflected pulses at a base location. The distance to the discontinuity is calculated by measuring the elapsed time between the transmitted and received pulses. A waveform is created on a display screen to shown the transmitted and reflected pulses, by taking a plurality of horizontal samples along the cable, and calculating a vertical value for each horizontal sample taken. Each horizontal sample is then converted to digital form and displayed on the screen. Preferably, a first voltage amplitude is utilized on transmitted pulses for all horizontal samples along a first predetermined length of the cable. An increased second voltage is utilized for horizontal samples taken along portions of the cable beyond the first predetermined length. The method also includes the step of adjusting the vertical value of each waveform horizontal sample by multiplying the vertical value by a factor which eliminates any vertical discontinuities which would occur at the location where the voltage increases. Another step in the method includes determining the gauge of the cable and then subtracting the exponential decay of the transmitted pulse waveform based upon that determined cable gauge so as to create a modified transmitted pulse which is displayed on the screen. The method also includes the step of adjusting the calculation of the distance to the discontinuity so as to account for a decrease in the velocity of propagation of the transmitted and received pulses over the length of the cable. A method for detecting a bridge tap in a twisted pair cable includes the steps of transmitting a pulse of energy onto the cable and receiving any reflected energy pulses at a base location. The gauge of the cable is then determined and the phase of any reflected energy pulses are determined. The amplitude and distance from the base location is determined for each reflected pulse which is out of phase relative to the transmitted energy pulse, to create pulse values. These pulse values are then compared with predetermined pulse values for the particular cable gauge and type to identify the location of a pulse value which is within a predetermined range of pulse values for a bridge tap discontinuity.

BRIEF DESCRIPTION OF THE DRAWINGS

FIG. 14 is a flow chart of the draw data lines routine of FIG. 13;

FIG. 15 is a flow chart of the take sample routine of FIG. 13;

FIG. 16 is a flow chart of the return loss routine of FIG. 13;

FIG. 17 shows an example of a screen display for the calculation of return loss;

DESCRIPTION OF THE PREFERRED EMBODIMENT

Figure 8:
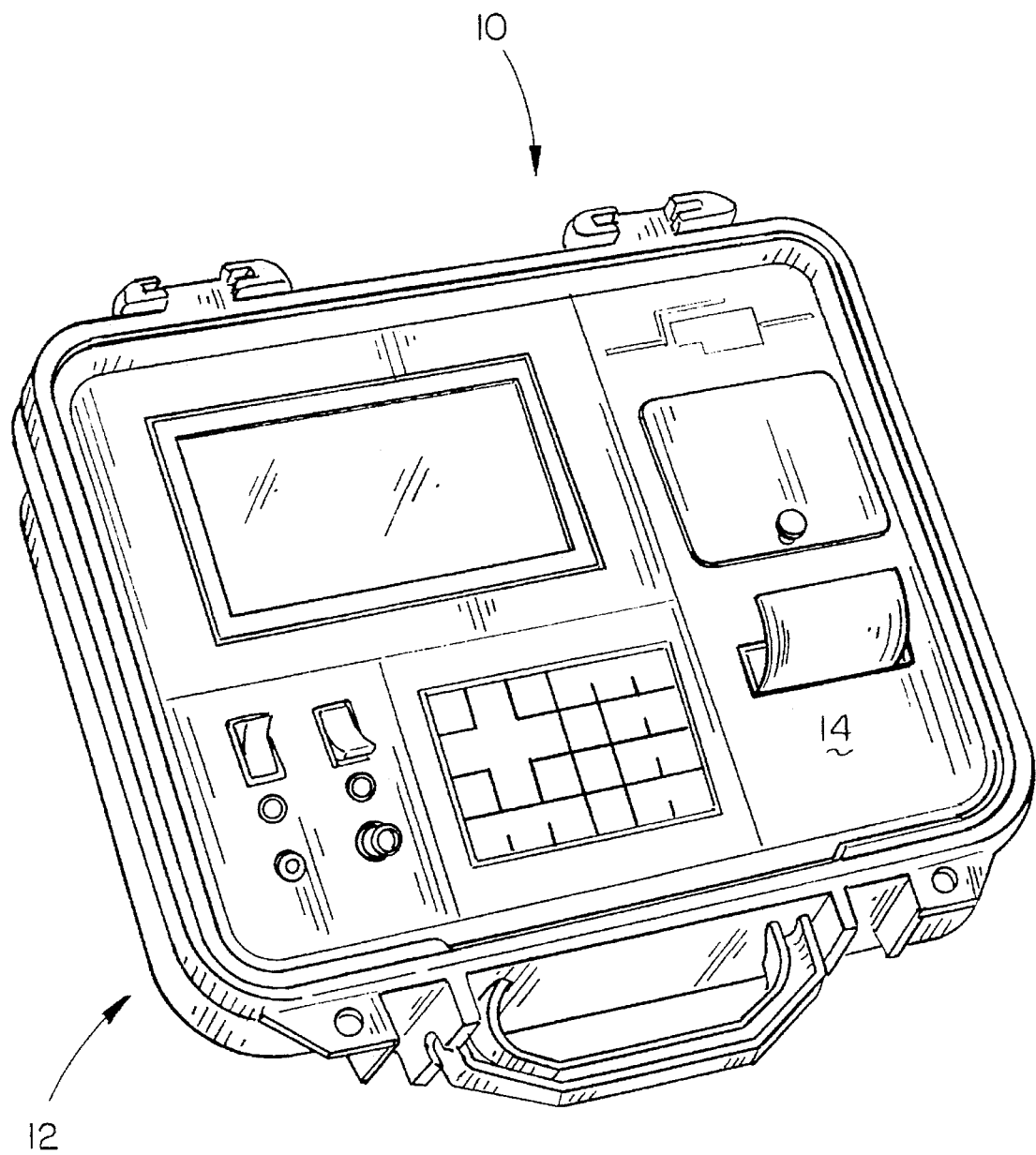
FIG. 8 is a perspective view of a time domain reflectometer of the present invention.

Referring now to the drawings, in which similar or corresponding parts are identified with the same reference numeral, and more particularly to FIG. 8, the time domain reflectometer of the present invention is identified generally at 10 and includes a housing 12 having a front panel 14 with a variety of controls and displays, as discussed in more detail hereinbelow.

Figure 9:
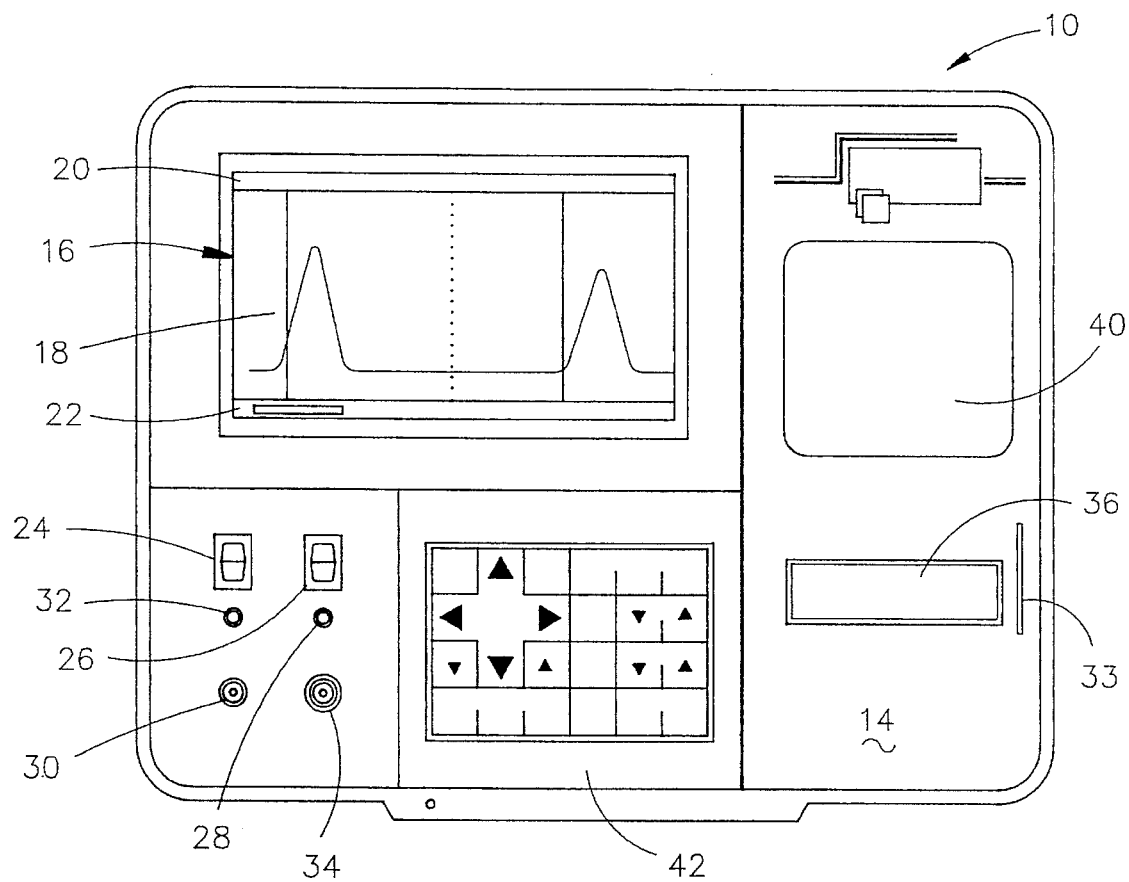
FIG. 9 is an enlarged plan view of the front panel of the TDR.

Referring now to FIG. 9, front panel 14 includes a liquid crystal display 16 with electroluminescent back lighting. Liquid crystal display (LCD) 16 is a 128 by 256 dot matrix high speed display with a central portion 18 showing waveform, and upper and lower horizontal data lines 20 and 22 displaying instrument settings, messages and measurements.

A switch 24 is located below LCD 16 and is connected to the electroluminescent back light of the LCD, to turn the same on and off. An on/off switch 26 selectively provides power to the TDR unit 10, and is electrically connected to a light emitting diode 28 which will illuminate when the power to the TDR is on.

A charging socket 30 permits an external battery charger to be connected to the unit to charge a battery pack (not shown) within the unit. An LED 32 will illuminate when the battery pack is being charged. A front panel connector 34 provides a connection for the cable to be placed under test by the unit.

A printer 36 is provided to print a hard copy of the waveform of the cable under test. A paper release lever 38 permits the paper for the printer to slide through the roller mechanism when loading the printer. A paper well 40 houses a roll of printer paper.

The final major component of the front panel 14 is key pad 42 having a plurality of membrane type switch controls, as described in more detail hereinbelow.

Figure 10:
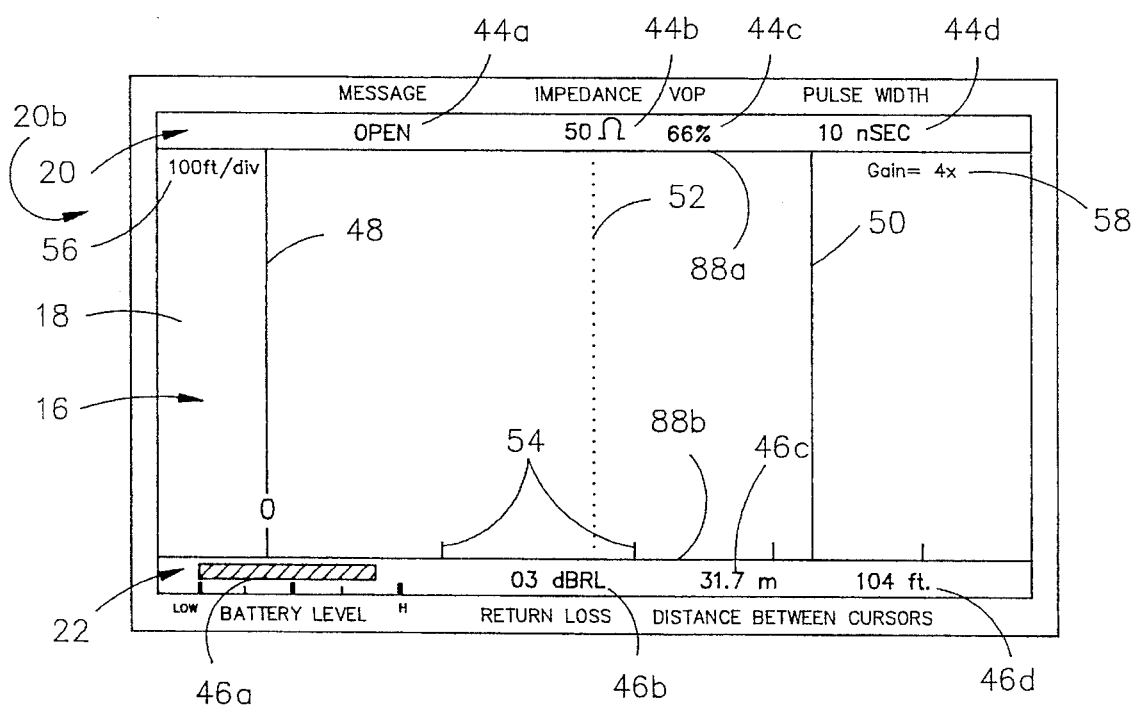
FIG. 10 is a super enlarged view of the liquid crystal display screen of the TDR.

Referring now to FIG. 10, an enlarged view of LCD 16 is shown, with an example of information displayed from the analysis of a cable. Upper horizontal data line 20 includes two rows of display locations. Upper row 20a has four individual display locations 44a, 44b, 44c and 44d, while lower row 20b has two display locations 56 and 58. Display location 44a is a message center which displays information about the waveform and the status of the instrument. Examples of messages which are displayed in display location 44a include: powered cable, noise filter, searching, printing, print disable, paper empty, printer error, low battery, open, and short. Display location 44b displays the output impedance setting selected by the operator. Display location 44c displays the velocity of propagation programmed by the operator, which is displayed as a percentage of the speed of light. Display location 44d displays the pulse width (in nanoseconds) selected by the operator.

The lower horizontal data line 22 also includes two rows of display locations. Lower row 22a has four individual display locations 46a, 46b, 46c and 46d, while upper row 22b has a plurality of display locations 54. Display location 46a is the battery level indicator in the form of a horizontal bar graph. Display location 46b displays the signal return loss in decibels. Display location 46c displays the distance, in meters, between first and second cursors 48 and 50. Display location 46d gives the distance between cursor lines 48 and 50, measured in feet.

Central portion 18 of LCD 16 includes a number of individual pieces of information. As noted above, cursors 48 and 50 are vertical lines on LCD 16. A center screen marker 52 is a vertical dashed line which is used as a reference when placing cursors 48 and 50 on the waveform. A plurality of distance markers 54 are displayed along upper row 22b of lower data line 22 and are indicated in feet or meters to verify the distance along the waveform being viewed. Along the left hand side of row 22b individual display location 56 displays the distance between markers 54. A separate individual display location 58 along the right side of row 22b displays the vertical gain setting being used in viewing the waveform.

Figure 11:
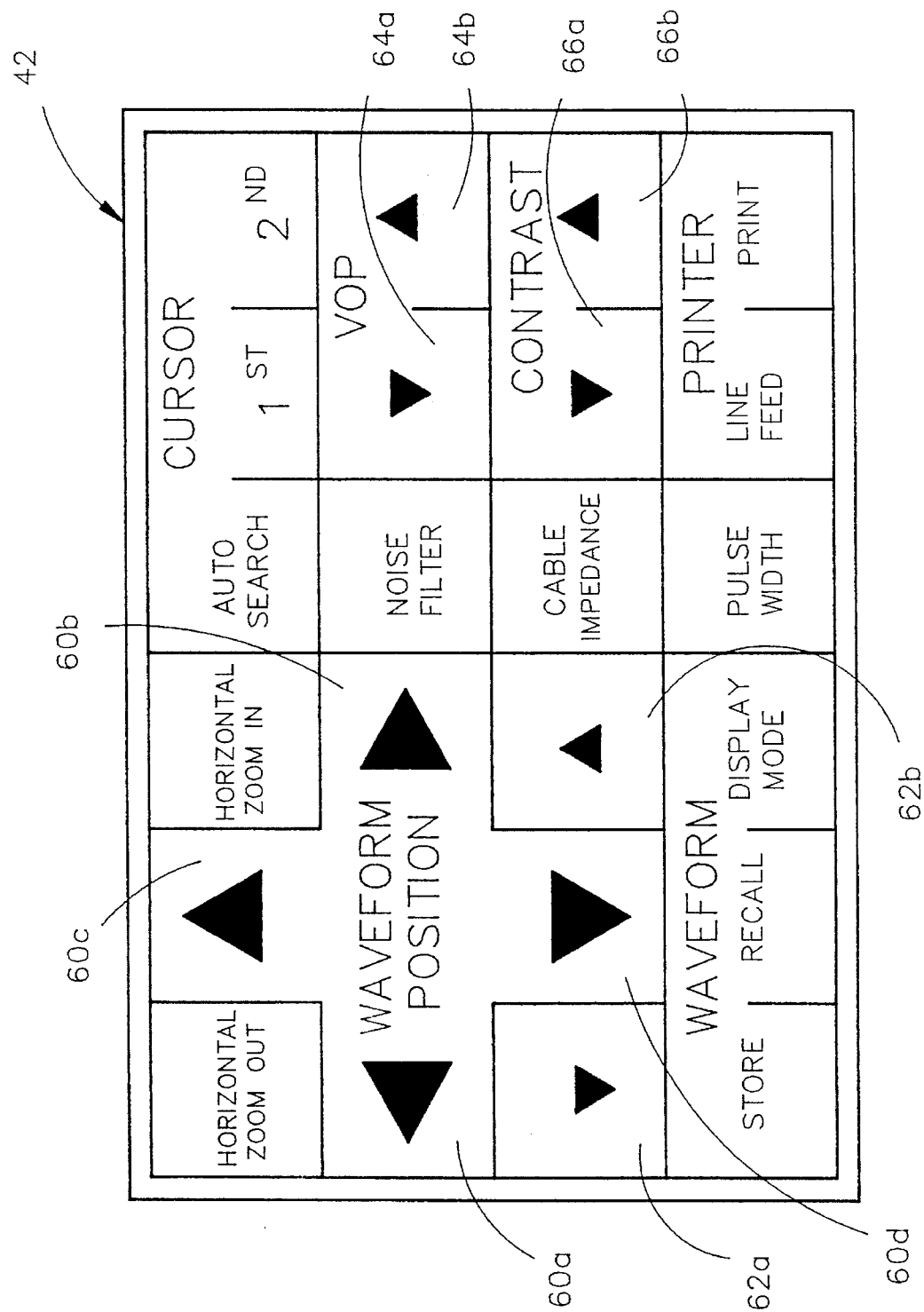
FIG. 11 is a super enlarged plan view of the key pad of the TDR.

Referring now to FIG. 11, an enlarged view of key pad 42 is shown. Four key pad controls 60a, 60b, 60c and 60d are provided for moving the displayed waveform left, right, up, and down, respectively, on LCD 16 (shown in FIG. 10). The "horizontal zoom out" and "horizontal zoom in" key pad switches expand and contract the horizontal waveform around center screen 52. Vertical gain switches 62a and 62b permit vertical expansion and contraction of the waveform on the LCD.

The waveform "store", "recall", and "display mode" keys are utilized to operate waveform storage and comparison features of the TDR 10.

Three cursor keys are provided, namely: auto search, first, and second. The auto search key starts an automatic cursor placement software program which automatically places cursors 48 and 50 (shown in FIG. 10) at the leading edges of the transmitted and reflected pulses. The first and second cursor keys place a cursor at the center screen marker 52 upon activation, and locks the cursor in place on the selected location of the waveform. Thus, as the waveform is moved utilizing position keys 60a, 60b, 60c and 60d, cursor lines 48 and 50 will move therewith.

The noise filter key manually engages a multifunction noise filter which permits the operator to try various noise filter functions. The cable impedance key permits the selection of one of a plurality of preset impedance values. The pulse width key permits selection of the output pulse width from a plurality of preset widths.

VOP keys 64a and 64b permit adjustment of the velocity of propagation to be set. Contrast keys 66a and 66b permit the contrast level of the LCD to be decreased and increased.

Finally, two printer keys are provided: (1) a line feed key which advances the printer paper, and (2) a print key which activates the printer to print the waveform viewed on the LCD.

Figure 12:
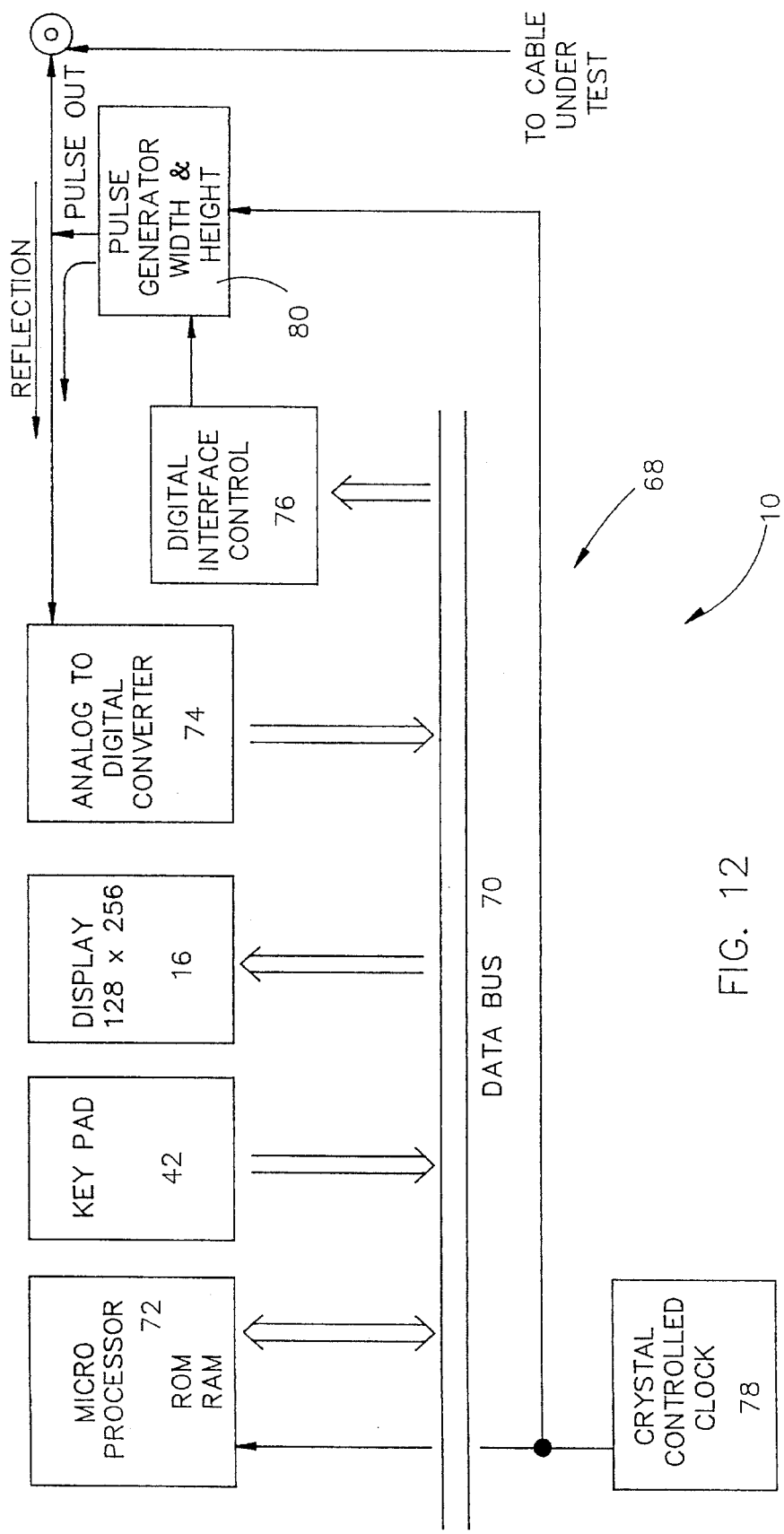
FIG. 12 is a block diagram of the internal electrical components of the TDR.

Referring now to FIG. 12, the central control circuit 68 of TDR 10 includes a data bus 70 electrically interconnecting a computer or microprocessor 72, key pad 42, display screen 16, analog-to-digital converter (A/D converter) 74 and a digital interface and control 76. Microprocessor 72 includes both ROM and RAM, as well as software for controlling the operation of TDR 10. As shown in FIG. 12, microprocessor 72 both transmits and receives information from data bus 70.

Key pad 42 only transmits information to data bus 70, and thus a single headed arrow is utilized to show this information transfer. Display 16 only receives information from data bus 70 and thus the single headed arrow connecting display 16 to data bus 70 is oriented in the opposite direction.

The A/D converter 74 converts the analog signals of a transmitted or reflected pulse to digital form, for display on LCD 16. The digital interface and control 76 is utilized to select and control a pulse to be transmitted down cable 34 under test.

A crystal controlled clock 78 transmits information to microprocessor 72 and to a pulse generator 80 which is supplied data from digital interface and control 76. Pulse generator 80 transmit pulses to the cable under test as well as to the analog to digital converter.

Figure 13:
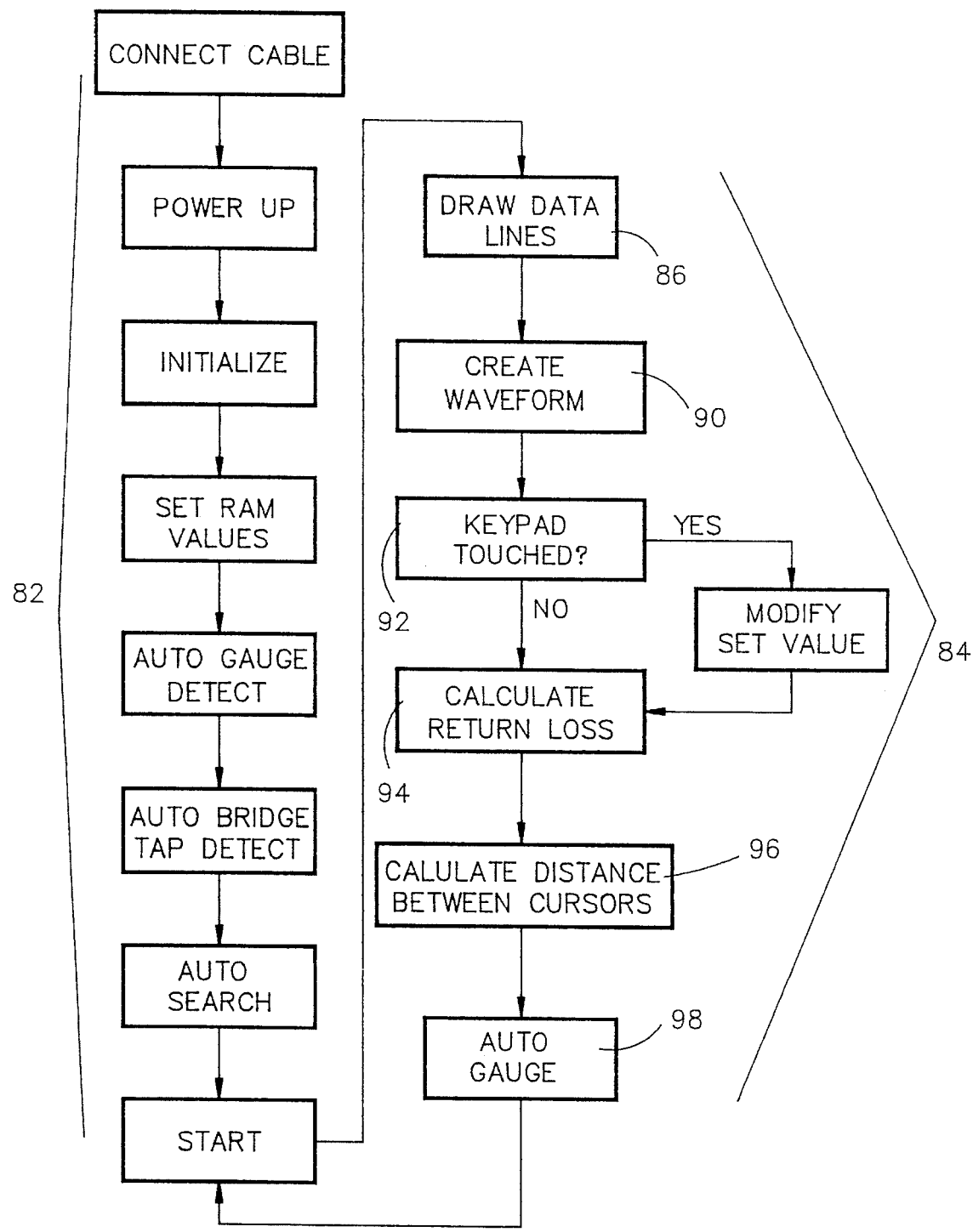
FIG. 13 is a flow chart showing the method of use of the TDR.

Referring now to FIG. 13, a flow chart showing the operation of TDR 10 is shown. The operational sequence may be broken down into two general components: an "initialize and initial values" routine 82 and a main program 84 which draws screens and calculates values. As shown in the drawings, the initial step of the procedure is to connect the cable to be tested to the front panel connector 34 (shown in FIG. 9). The power on/off switch is then activated to provide power to the unit. Upon power up, the RAM and the LCD are initialized. RAM values are then automatically set based upon predetermined settings or settings previously manually input in the apparatus. Such RAM values includes impedance, VOP, screen contrast, and pulse width.

The TDR microprocessor then automatically runs three preliminary routines: (1) an AUTOMATIC GAUGE DETECT routine; (2) an AUTOMATIC BRIDGE TAP DETECT routine; and (3) an AUTOMATIC SEARCH routine. Upon completion of these three automatic routines, the main program of the method is initiated and identified at START. The first step in the main program of the routine is the running of a DRAW DATA LINES routine 86. A flow chart of the DRAW DATA LINES routine 86 is shown in FIG. 14.

Referring to FIGS. 14 and 10, the first step of the DRAW DATA LINES routine 86 is the DRAW UPPER DATA LINES subroutine. This subroutine draws characters for the upper two data lines 20a and 20b with blanks for certain values to be determined at a later time. The second step is the DRAW LOWER DATA LINES subroutine. This program draws characters for the lower two data lines 22a and 22b with blanks for certain values to be determined at a later time.

The last two steps of the DRAW DATA LINES routine 86 includes the step of drawing the upper solid line and the lower solid line 88a and 88b respectively on LCD 16, to form the boundaries of central portion 18 of the LCD screen 16.

Upon completion of the DRAW DATA LINES routine 86, the microprocessor then runs the CREATE WAVEFORM routine 90 in order to create a waveform on central screen portion 18. Referring to FIG. 15, a flow chart for the CREATE WAVEFORM routine 90 begins with the step of loading the X register value. In this case, since the LCD screen 16 is 256 pixels wide, the X register value is 256, and 256 horizontal samples are taken to fill the screen. Next, the Y register value is loaded and set equal to the first sample location value. The horizontal zoom value is then loaded into a memory register, which defines the distance between the samples. The Y register value is then loaded into the time base counter.

The next step is to run the time base counter, which transmits a pulse at a predetermined time count, as discussed in more detail below. A SAMPLER routine is then run to determine a Y value at a particular X access location, which is converted to digital form and then transmitted as a waveform pixel to LCD screen 18. The SAMPLER routine then draws the pixel on the screen.

Upon completion of the SAMPLER routine, the Y register is incremented by the horizontal zoom value, and the X register is decremented by one. The microprocessor then determines whether the X register value is equal to 0. If not, the system loops to the step of loading the Y register value into the time base counter and proceeding through the steps of: (1) running the time base counter; (2) running the SAMPLER routine; (3) incrementing the Y register value and (4) decrementing the X register value. Once the X register value equals 0, a full screen has been completely drawn, and the routine 90 is completed.

Upon completion of the CREATE WAVEFORM routine 90, the microprocessor checks the status of the key pad to determine whether the key pad has been touched. If so, then the appropriate RAM value is modified by the microprocessor, which then continues to the return less calculation. If no key has been touched, the microprocessor continues directly to the RETURN LOSS CALCULATION routine. As noted above, some of the RAM values which may be modified include: impedance, VOP, screen contrast and pulse width.

Referring now to FIGS. 16 and 17, the RETURN LOSS CALCULATION routine measures the impedance changes in the cable being tested. Essentially, this routine measures the difference in amplitudes between the transmitted pulse $P_T$ and the reflected pulse $P_R$. Because a small difference in amplitudes indicates that most of the pulse energy is reflected by the cable fault, a small value return loss number indicates a larger more major fault, while a larger return loss number indicates a smaller fault.

The first step of the RETURN LOSS CALCULATION routine, shown in FIG. 16, is to determine the minimum value of the transmitted pulse $P_T$ (as shown in FIG. 17), by scanning to the left of first cursor 48. The next step is to determine the maximum value of transmitted pulse $P_T$, by scanning to the right of first cursor 48. The minimum and maximum values of the reflected pulse are then determined by scanning to the left and right of second cursor 50, respectively, and all of these values are utilized in determining the return loss in the calculations step. More specifically, the algorithm for determining the return loss is $dBRL = 20 \log_{10} V_o/V_r$ where $V_o$ is the amplitude of the transmitted pulse and $V_r$ is the amplitude of the reflected pulse. Finally, the DRAW step draws the value in display location 46b on LCD 16.

Upon completion of the RETURN LOSS CALCULATION step 94, the microprocessor continues to the DISTANCE BETWEEN CURSORS step 96, as shown in FIG. 13. As discussed in the background of the invention, the speed at which a signal travels down a cable is called the velocity of propagation (VOP). Various cables have various VOP factors from as low as 40% to as high as 99%, although most cable VOP numbers range between 60%–90%. In addition, cable dielectric material varies from one manufacture to another, from one manufacturing run to another, and with temperature (approximately 1% for every 10° centigrade of change from room temperature). Age, water in the cable, and cable reclamation compounds may also effect the dielectric material of a cable. With changes in the dielectric constant, the velocity of propagation changes and therefore the apparent length of the cable also changes. All of these factors effect the determination of the distance between cursors, since this distance is calculated based directly upon the VOP.

Figure 18:
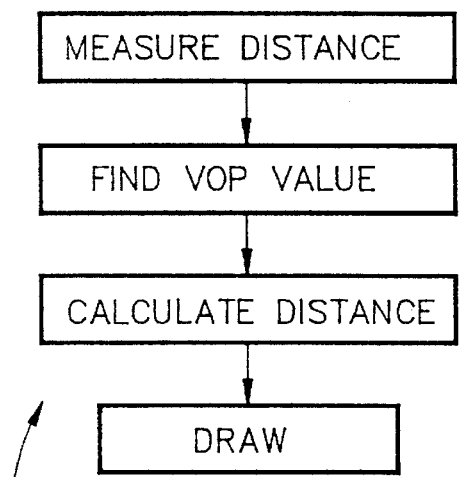
FIG. 18 is a flow chart of the distance between a cursors routine of FIG. 13.

As noted above, the user of the TDR may set the VOP of the cable based upon various lookup tables provided to the user. While the lookup tables provide an effective VOP factor, there is an additional factor which must be considered in calculating the distance between cursors (and thus the distance to the fault detected by the TDR). The applicant herein has determined that VOP decreases with cable length. For this reason, the inventor has provided for the adjustment of the VOP in the calculation of the distance between cursors. As shown in FIG. 18, the initial step in the DISTANCE BETWEEN CURSORS routine 96 is a preliminary measurement of the distance between cursors. Next, a VOP value is determined which takes into consideration the decrease in VOP as the length of the tested cable is increased. One of five value figures is determined, based upon the preliminary measured distance between cursors. If the distance is less than 1,000 feet, then the actual VOP value is utilized. For distances between 1,001 and 3,000 feet, the VOP value is preliminary value minus 1; for distances between 3,001 and 5,000 feet, the value is initial value minus 2; for distances between 5,001 and 7,000 feet, the VOP value is initial value minus 3; and for distances between 7,001 and 9,000 feet, the value is equal to the initial value minus 4. The next step is to calculate actual distance by applying the VOP value to the preliminary measured distance, thereby correcting for VOP decrease over a given cable length. The final step is to draw the calculated distance in individual display locations 46c and 46d on screen 16.

Figure 19:
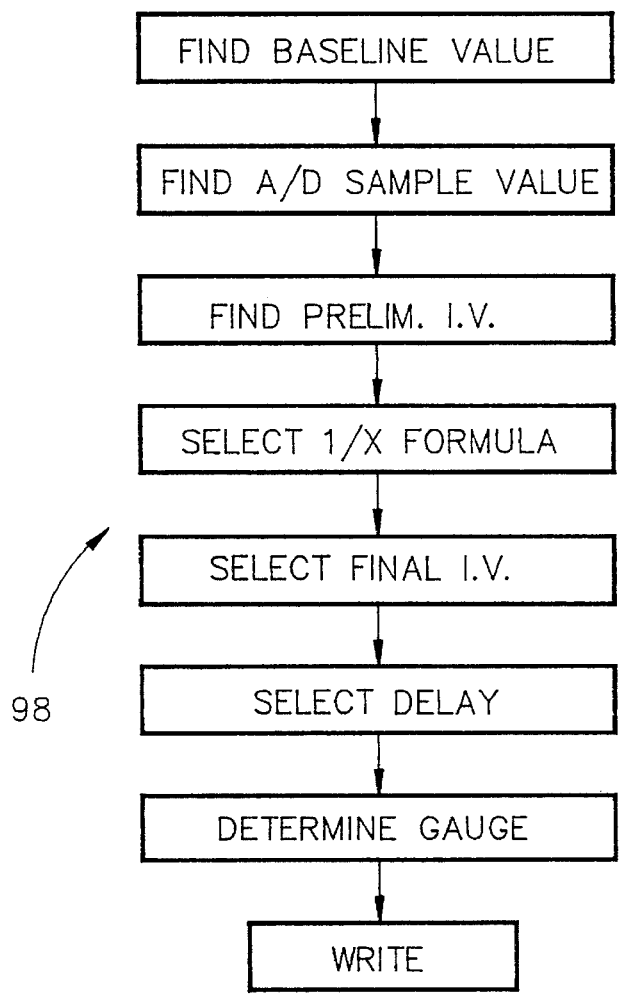
FIG. 19 is a flow chart of the auto gauge routine of FIG. 13.

Upon completion of the DISTANCE BETWEEN CURSORS routine 96, the microprocessor completes a cycle by running an AUTO GAUGE routine 98 which determines the gauge size of the cable and selectively writes the cable gauge to screen. As shown in FIG. 19, and first step of the AUTO GAUGE routine includes the step of finding the value of a base line ahead of the transmitted pulse. The value of the first A/D sample on the following edge of the transmitted pulse is then determined. The A/D sample is a function of the pulse width and the gauge of the cable under test, and is designated as the preliminary initial value.

Figure 7:
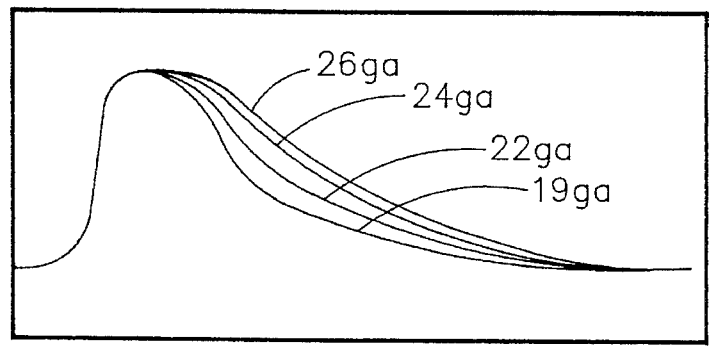
FIG. 7 shows a digitized waveform of an incidental pulse with the effects of decay based upon the gauge of the cable.

All twisted pair cable, regardless of gauge, has a decay slope of 1/X. An example of various decay slopes for a variety of twisted pair cable gauges is shown in FIG. 7. The difference between the decay slopes in the various gauges is the rate of decay. Based upon the preliminary initial value, one of several 1/X formulas is selected.

From a lookup table, a final initial value is selected which gives the best approximation of a match of the base line. From the selected 1/X formula, the best decay is selected which will best match the baseline. Cable gauge is then determined by selecting the best match from lookup tables having different initial values and associated wire gauge for each pulse width. Once the cable gauge is determined, it is written on screen 16.

Referring once again to FIG. 13, upon completion of the AUTO GAUGE routine 98, the microprocessor returns to the START step.

As discussed in more detail above, the maximum testable cable length is a function of cable loss, pulse height, and receiver sensitivity. Of these three, the pulse height is the easiest to adjust. The inventors have provided a method for increasing the maximum testable cable length (thereby increasing the sensitivity of the TDR) by providing a variable pulse amplitude based upon cable length. Thus, in the CREATE WAVEFORM routine 90, shown more specifically in FIG. 15, the step of running the time base counter includes the step of transmitting a pulse with an amplitude dependent upon the distance to the horizontal sample being taken. If the distance is less than 1,000 feet, then the time base counter transmits a 5 volt pulse. If the distance is 1,001–10,000 feet, the time base counter transmits a 7.5 volt pulse. For distances greater than 10,001 feet, the time base counter transmits a 10 volt pulse. Thus, the pulse height is made changeable "on the fly" such that as distances become progressively longer, the transmitted pulse becomes progressively higher in amplitude, yet is limited in amplitude so as not to overdrive the sampler and A/D converter.

Figure 20:
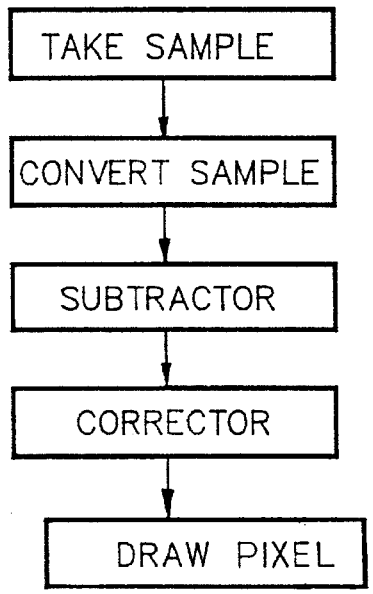
FIG. 20 is a flow chart of the sampler subroutine of FIG. 15.

As shown in the flow chart in FIG. 15, the CREATE WAVEFORM routine 90 creates a waveform on LCD screen 16. However, because of the exponential decay of the cable and the variable pulse height, the waveform would be difficult to interpret without some visual correction. For this reason, the SAMPLER routine utilized to take an analog sample, converted to digital form and transmit a waveform pixel to the screen includes software for modifying and correcting the waveform prior to transmission to the LCD screen 16. As shown in FIG. 20, the initial step of the SAMPLER routine is to take an analog sample utilizing the A/D converter. The sample is then converted to digital form and a SUBTRACTER routine modifies the value for exponential decay. A CORRECTOR routine then modifies the output for the variable pulse height wherein the corrected value is transmitted as a waveform pixel to be drawn on the screen.

Figure 1:
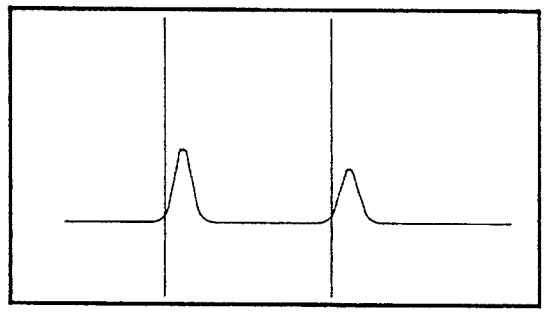
FIG. 1 shows a digitized waveform of an incident pulse at a reflected pulse.
Figure 2:
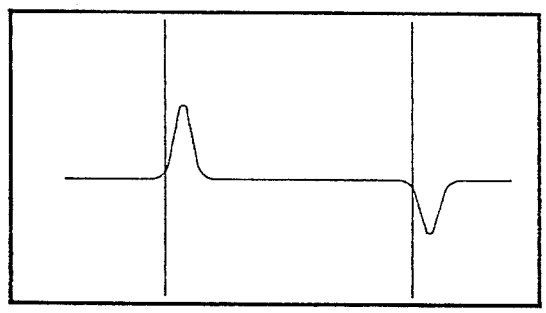
FIG. 2 shows a waveform of an incident pulse and a second type of reflected pulse.
Figure 3:
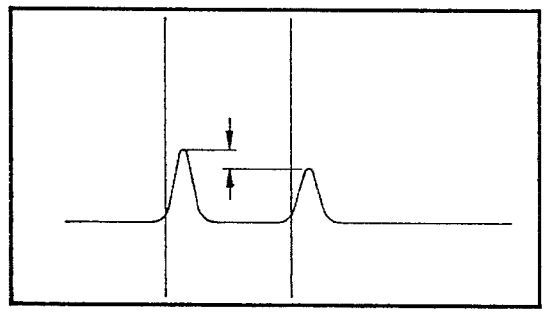
FIG. 3 shows a waveform and the effects of cable loss on the reflected pulse.
Figure 4:
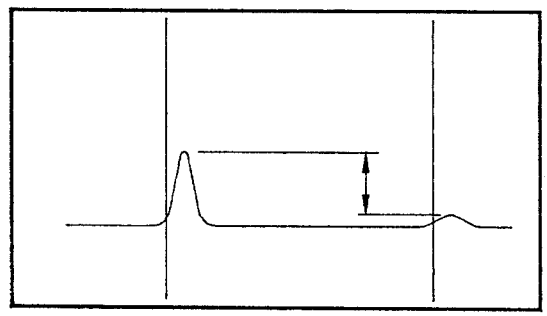
FIG. 4 shows a waveform and the effect of cable loss on a reflected pulse.
Figure 5:
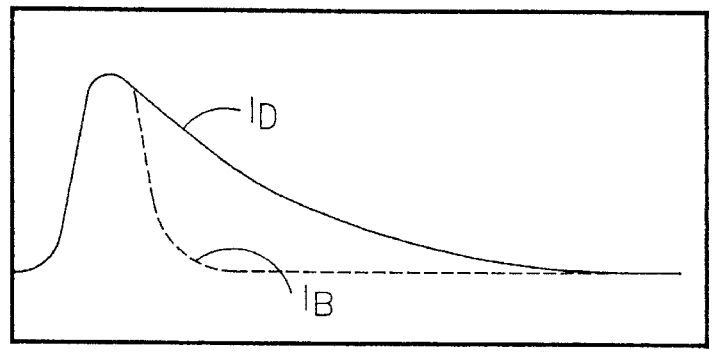
FIG. 5 shows an incidental waveform with the effects of exponential decay of a cable.
Figure 6:
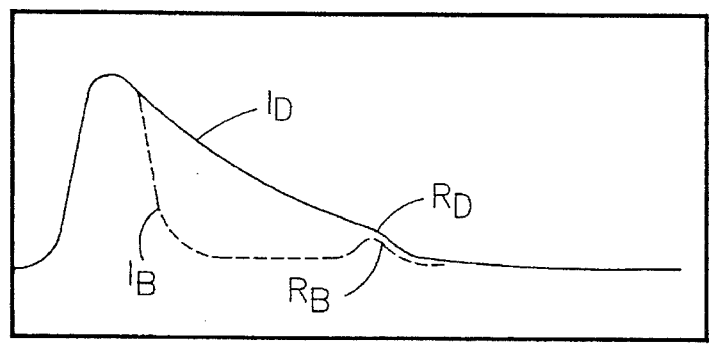
FIG. 6 shows a waveform with exponential decay and a reflected pulse.
Figure 21:
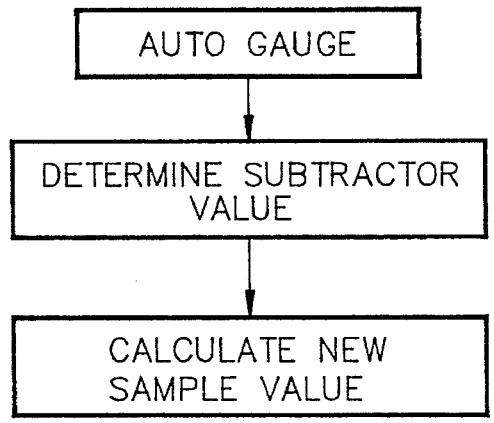
FIG. 21 is a flow chart of the subtracter subroutine of FIG. 20.

The SUBTRACTER subroutine utilizes the AUTO GAUGE routine shown in FIG. 19 so as to determine the cable gauge. Referring now to FIG. 21, the AUTO GAUGE routine provides an initial value and a decay which are utilized to determine a SUBTRACTER value. A new sample value is then calculated by subtracting the SUBTRACTER value from the A/D sample value. As shown in FIG. 6, use of the SUBTRACTER subroutine corrects the waveform from the form shown in solid lines to the form shown in dashed line. Because different gauges of cable have different exponential decay rates, the AUTO GAUGE routine determines the gauge of the cable so as to apply the appropriate subtracter in the SUBTRACTER routine.

Figure 22:
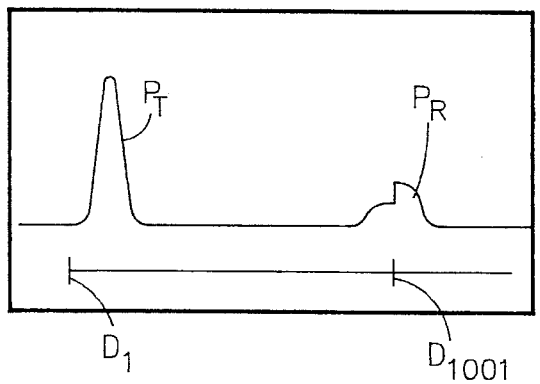
FIG. 22 shows a screen display with an example of a variable pulse discontinuity.

Because the variable pulse height provided in the time base counter program of the take sample routine is incremental, the displayed waveform would have discontinuities in the shape of a sawtooth or the like, as shown in FIG. 22. Assuming that the distance being displayed on the screen is more than 1,000 feet, and the reflected pulse $P_r$ is located at a distance of 1,000 feet (thus $D_1$ is equal to 1,000 feet) a waveform such as that shown in FIG. 22 would be displayed if the CORRECTOR subroutine of the present invention were not utilized. Because the transmitted pulse at a location of 1,001 feet is 7.5 volts while the transmitted pulse at a location of 1,000 feet is 5 volts, the "sawtooth" form would describe the discrepancy at the change in voltage. The CORRECTOR routine multiplies the value of the sample by a factor based upon the location of the sample taken. The first sample taken at a particular voltage amplitude would have a correction of 1 times the actual sample value. Thus, locations $D_1$ and $D_{1,001}$ would have a correction factor of 1X. However, a sample taken at location $D_{1,000}$ is multiplied by a value such that the new value lines up with sample $D_{1,000}$. Samples between $D_{1,000}$ and $D_1$ would be multiplied by factor proportionally smaller as the sample location approaches $D_1$. Arithmetically, this factor would be $V_2/V_1(D_{HS}/D_{FL})$, where $V_2$ equals the second voltage (7.5 volts), $V_1$ equals the first voltage (5.0 volts), $D_{HS}$ represents the distance to the horizontal sample being taken and $D_{FL}$ represents the distance to the change of voltage location.

Figure 23:
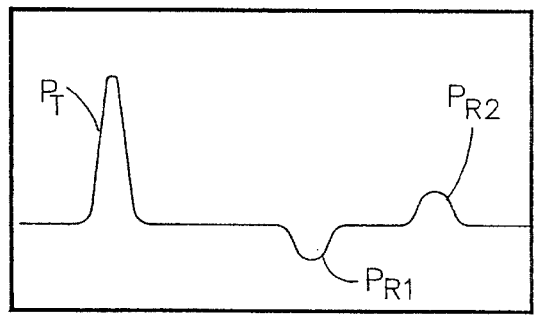
FIG. 23 shows a screen display of a typical bridge tap discontinuity.

FIG. 23 is a diagram showing the screen of the TDR with a transmitted pulse $P_T$. A bridge tap reflected pulse $P_{R1}$ and an end of cable reflected pulse $P_{R2}$. A twisted pair cable has a nominal impedance of 125 ohms. Two 125 ohm cables which are bridged together cause a one-half impedance at the point of connection. Thus, at the point of the bridge tap, the cable impedance will be 62.5 ohms.

Figure 24:
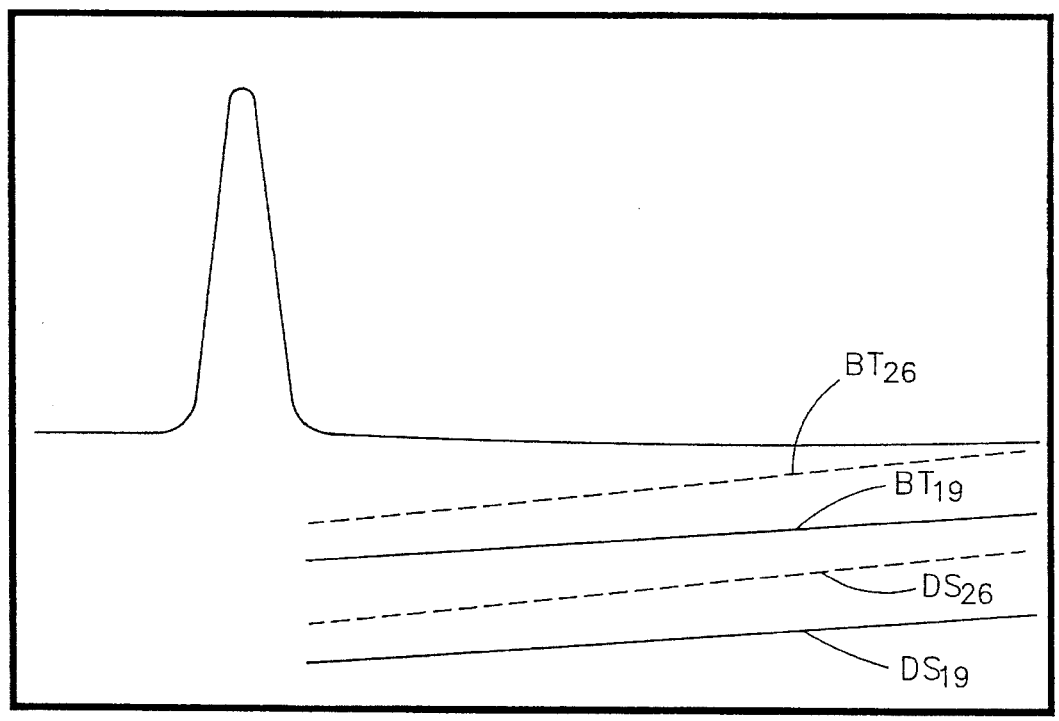
FIG. 24 shows a screen display with theoretical dead short lines and bridge tap lines for 19 and 26 gauge cables.

The BRIDGE TAP DETECT routine is software which includes an algorithm that scans the length of the cable under test looking for a discontinuity. Because a bridge tap is a lowering of the cable impedance, the software is designed to distinguish between the signature of a dead short and a bridge tap. The only difference between the two waveform characteristics is the amplitude of the reflected pulse. The software compares the frequency versus loss characteristics of various cable types with the amplitude of the reflection. Based upon the amplitude of typical short circuit reflections at various distances, a line may be drawn which fits the profile of a dead short at various distances. In FIG. 24, $DS_{19}$ is a line depicting the amplitude of a dead short for a 19 gauge cable at various distances from the TDR. Dashed line $DS_{26}$ is a similar dead short line for a 26 gauge cable. Using similar information, a line may also be drawn for the expected amplitude of a bridge tap. Solid line $BT_{19}$ would be such a line for 19 gauge cable while dashed line $BT_{26}$ is an example of a bridge tap line for 26 gauge cable. The bridge tap line for cable gauges falling between 19 and 26 would have a proportional slope between the two bridge tap lines shown in FIG. 24.

The software of the AUTO BRIDGE DETECT routine automatically compares the amplitude of the reflected pulse with the dead short and bridge short lines of the particular cable gauge under analysis and can thereby distinguish between a bridge tap discontinuity and a simple cable fault. If the reflected pulse has an amplitude laying proximal the bridge tap line for the gauge cable, the software will make a determination that the fault is a bridge tap and display this information on the instrument screen for the operator.

Referring once again to FIG. 13, it can be seen that an AUTO GAUGE DETECTION routine is utilized prior to the AUTO BRIDGE TAP DETECT routine, since the gauge of the cable must be known in order to utilize the bridge tap detection algorithm incorporated in the software of the BRIDGE TAP DETECTION routine.

Whereas the invention has been shown and described in connection with the preferred embodiments thereof, it should be understood that many modifications, substitutions and additions may be made which are within the intended broad scope of the appended claims.

I claim:

1. A method for detecting impedance discontinuities in two-conductor cable and displaying their location, comprising the steps of:

transmitting a pulse of energy on to the cable at a base location;

receiving any reflected pulses at the base location;

measuring the elapsed time from the transmission of the pulse to the receipt of any reflected pulses;

calculating the distance from the base location to a discontinuity causing a reflected pulse;

determining the gauge of the cable;

determining the exponential decay of the waveform of the transmitted pulse based upon the determined cable gauge;

subtracting the exponential decay from the value of the transmitted pulse to create a modified transmitted pulse value; and creating a waveform on a display screen showing the modified transmitted pulse and any reflected pulses.

2. The method of claim 1, wherein the step of determining the cable gauge includes the steps of:

(a) taking a predetermined number of horizontal samples along the cable to fill a horizontal length of a display screen;

(b) determining a value for a baseline ahead of the transmitted pulse waveform;

(c) determining a preliminary initial value of the first horizontal sample on the following side of the transmitted pulse waveform;

(d) selecting a decay slope from a plurality of predetermined decay slopes, based upon the preliminary initial value; and (e) selecting a cable gauge by matching said decay slope one of a plurality of decay slopes in a look up table having different decay slopes based upon a variety of initial values and wire gauges for various pulse widths.

* * * * *